(12) United States Patent
Ponoth et al.

(10) Patent No.: US 9,379,236 B2
(45) Date of Patent: Jun. 28, 2016

(54) LDMOS DEVICE AND STRUCTURE FOR BULK FINFET TECHNOLOGY

(71) Applicant: BROADCOM CORPORATION, Irvine, CA (US)

(72) Inventors: Shom Surendran Ponoth, Irvine, CA (US); Akira Ito, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 113 days.

(21) Appl. No.: 14/309,843

(22) Filed: Jun. 19, 2014

(65) Prior Publication Data

US 2015/0357462 A1 Dec. 10, 2015

Related U.S. Application Data

(60) Provisional application No. 62/007,832, filed on Jun. 4, 2014.

(51) Int. Cl.
*H01L 29/66* (2006.01)
*H01L 29/78* (2006.01)

(52) U.S. Cl.
CPC ...... *H01L 29/7816* (2013.01); *H01L 29/66681* (2013.01); *H01L 29/66795* (2013.01); *H01L 29/7851* (2013.01)

(58) Field of Classification Search
CPC .................. H01L 29/66681; H01L 29/66795; H01L 29/7816; H01L 29/7851
See application file for complete search history.

(56) References Cited

U.S. PATENT DOCUMENTS

| 9,082,852 B1* | 7/2015 | Liu | H01L 29/785 |
| 2007/0267693 A1* | 11/2007 | Chien | H01L 21/823892 |
| | | | 257/343 |
| 2010/0140701 A1* | 6/2010 | Kim | H01L 21/26533 |
| | | | 257/343 |
| 2012/0193707 A1* | 8/2012 | Huang | H01L 29/7816 |
| | | | 257/335 |
| 2014/0167173 A1* | 6/2014 | Ito | H01L 29/66659 |
| | | | 257/368 |
| 2014/0183628 A1* | 7/2014 | Ito | H01L 29/7816 |
| | | | 257/335 |
| 2014/0191315 A1* | 7/2014 | Ito | H01L 29/66484 |
| | | | 257/336 |
| 2014/0339649 A1* | 11/2014 | Campi, Jr. | H01L 29/7816 |
| | | | 257/409 |
| 2015/0035053 A1* | 2/2015 | Singh | H01L 29/7816 |
| | | | 257/337 |
| 2015/0357462 A1* | 12/2015 | Ponoth | H01L 29/66681 |
| | | | 257/329 |

FOREIGN PATENT DOCUMENTS

EP 2755238 A2 7/2014

* cited by examiner

*Primary Examiner* — Brett Feeney
*Assistant Examiner* — Sophia Nguyen
(74) *Attorney, Agent, or Firm* — McDermott Will & Emery LLP (57) ABSTRACT

A lateral double-diffused MOS (LDMOS) bulk finFET device for high-voltage operation includes a first-well region and two or more second-well regions formed on a substrate material and one or more non-well regions including substrate material. The non-well regions are configured to separate well regions of the second-well regions. A source structure is disposed on a first fin that is partially formed on the first-well region. A drain structure is disposed on a second fin that is formed on a last one of the second-well regions. One or more dummy regions are formed on the one or more non-well regions. The dummy regions are configured to provide additional depletion region flow paths including vertical flow paths for charge carriers to enable the high-voltage operation.

34 Claims, 6 Drawing Sheets

LDMOS DEVICE AND STRUCTURE FOR BULK FINFET TECHNOLOGY

CROSS-REFERENCE TO RELATED APPLICATIONS

This application claims the benefit of priority under 35 U.S.C. §119 from U.S. Provisional Patent Application 62/007,832 filed Jun. 4, 2014, which is incorporated herein by reference in its entirety.

TECHNICAL FIELD

The present description relates generally to integrated circuits, and more particularly, but not exclusively, to a lateral double-diffused MOS (LDMOS) device and structure for bulk fin field-effect transistor (finFET) technology.

BACKGROUND

There are a number of challenges that scaling of conventional planar metal-oxide-semiconductor field-effect transistors (MOSFETs) are faced with. For example, threshold swing degradation, large drain-induced barrier lowering (DIBL), device characteristics fluctuations, and leakage are among the most common problems that may be addressed by 3-D device structures. Fin field-effect transistors (FinFETs) are 3-D device structures that can be used in nano-scale complementary metal-oxide-semiconductor (CMOS) and high-density memory applications.

FinFET devices are divided into two categories, bulk finFETs and silicon-on-insulator (SOI) finFETs. In bulk finFET devices, which are more common in 14 nm and/or 16 nm technology, the fin can be formed on the bulk silicon (e.g., silicon substrate). The bulk finFET can be produced at low cost, low defect density, high heat transfer to substrate, and good process control. Bulk finFETs with lateral double-diffused MOS (LDMOS) structures, which are mostly used in RF power amplifiers, can provide a high breakdown voltage (e.g., between drain and source terminals). The high breakdown voltage is achieved, for example, by a charge carrier (e.g., electron) flow path that passes through a depletion region.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The subject technology may provide methods and implementations for providing bulk finFET devices with lateral double-diffused MOS (LDMOS) structures for high-voltage operations. In one or more implementations, the subject technology achieves higher breakdown voltage by increasing the flow path of the charge carriers (e.g., electrons in NLDMOS or holes in PLDMOS) in one or more additional depletion regions. The advantageous features of the disclosed solution include compatibility with the existing finFET-based CMOS device fabrication process flow without requiring any additional masks.

Figure 1A:
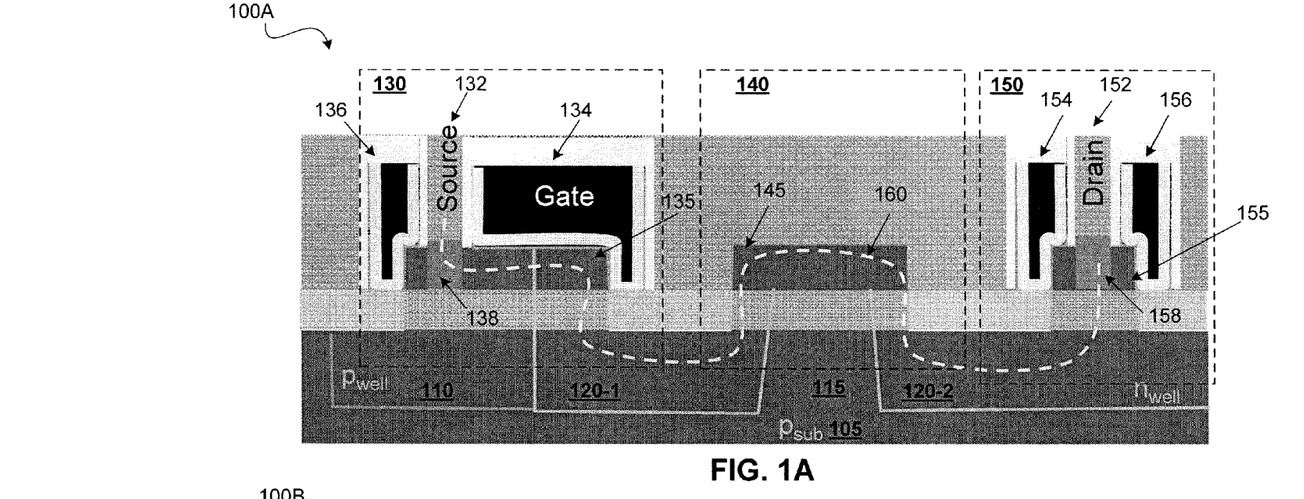
FIGS. 1A through 1C illustrate cross-sectional and top views of examples of a lateral double-diffused MOS (LDMOS) bulk finFET device for high-voltage operation in accordance with one or more implementations.
Figure 1B:
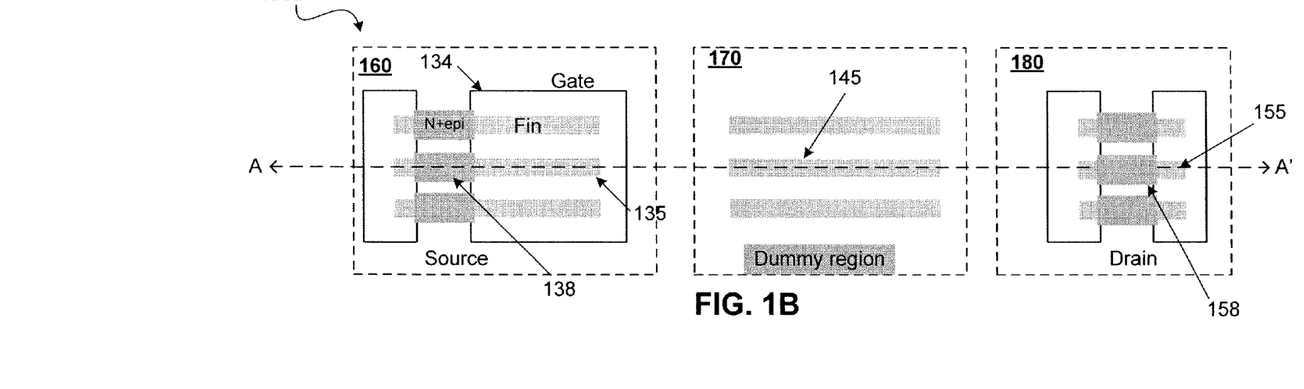
Figure 1C:
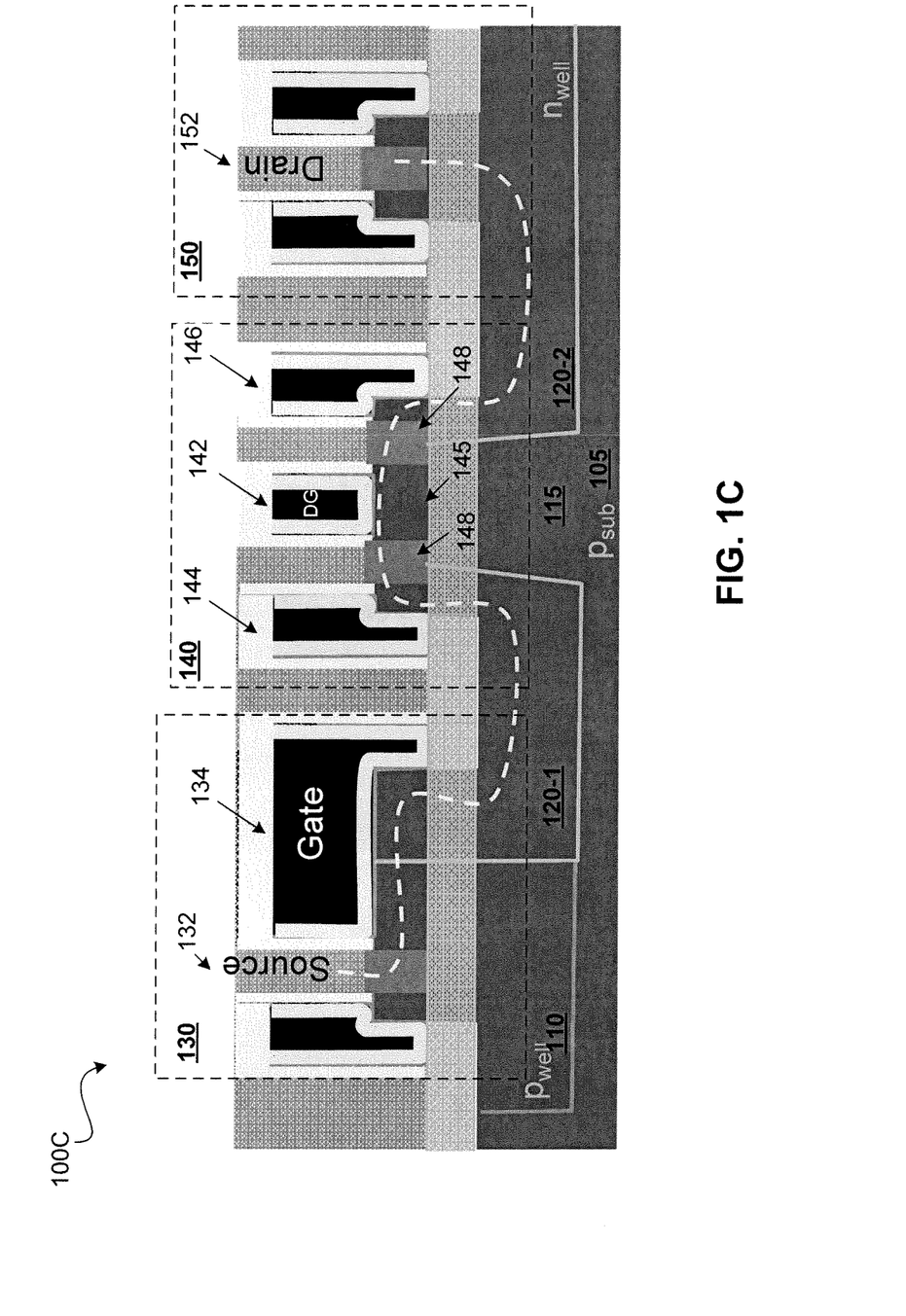

FIGS. 1A through 1C illustrate cross-sectional and top views of examples of a lateral double-diffused MOS (LD-MOS) bulk finFET device for high-voltage operation in accordance with one or more implementations. An LDMOS bulk finFET device (hereinafter "LDMOS device"), as shown in the cross-sectional view 100A, includes a first-well region 110 and two or more second-well regions, for example, 120-1 and 120-2 formed on a substrate material 105. The LDMOS device further includes one or more non-well regions, such as the non-well region 115. The non-well regions (e.g., 115) include the same material as the substrate material 105, whereas the first-well region and the second-well regions include doped semiconductor material (e.g., silicon). The non-well regions (e.g., 115) separate well regions (e.g., 120-1 and 120-2) of the second-well regions.

In one or more implementations, the LDMOS device, as shown in FIG. 1A, is an NLDMOS device formed on a substrate material (e.g., 105) consisting p-type silicon. In this case, the first-well region 110 is a p-well region doped with p-type impurity, and the second-well regions (e.g., 120-1 and 120-2) are n-well regions doped with n-type impurity for the charge carriers, which are electrons, to pass through. In some implementations, the region 115 can be a p-well region separating the n-well regions.

In some aspects, the LDMOS device can be a PLDMOS device fabricated on a substrate material consisting of deep n-well in silicon. The first-well region 110 can be an n-well region, and the second-well regions e.g., 120-1 and 120-2) can be p-well regions for the charge carriers (e.g., holes) to travel through. In some aspects, for the PLDMOS device, the region 115 can be an n-well, a deep n-well, or a combination of the n-well and the deep n-well.

A source structure 130 is disposed on a first fin 135 that is partially formed on the first-well region 110. A drain structure 150 is disposed on a second fin 155 that is formed on a last one of second-well regions (e.g., 120-2). One or more dummy regions (e.g., 140) are formed on the one or more non-well regions (e.g., 115). The dummy regions 140 can provide additional depletion region flow paths including vertical flow paths for charge carriers to enable the high-voltage operation. The high voltage operation of the LDMOS device depends, among other things, on the path length of the charge carriers (e.g., electrons) through the depletion regions. Without the dummy region(s) of the subject technology, the depletion regions would be formed only in the first well region 110 (e.g., p-well) and the second well region(s) 120 (e.g., n-well (s)), which would not be separated by the non-well region 115. The subject technology provides the additional depletion regions in the dummy region 140, which makes the charge carriers to pass through a lengthier path 160, than if the dummy region 140 did not exist (e.g., the existing technology). The additional depletion regions are formed at the junction of the non-well region 115 (e.g., p-type) and a dummy fin 145 (n-type) formed in the dummy region 140. The additional depletion regions extend both horizontally (e.g., along the top portion of the dummy fin 145) and vertically (e.g., along the side portions of the dummy fin 145) to increase the length of the path 160 of the charge carriers (e.g., electrons) in the depletion regions. The increased path length of the charge carriers in the additional depletion regions leads to higher device breakdown voltage (e.g., between a source 132 and a drain 152 of the LDMOS device).

The source structure 130 includes a source 132 built on the top of an epitaxial formation 138 covering a portion of the first fin 135, a dummy gate structure 136, and a gate structure 134. The gate structure 134 covers a portion of the first fin 135 including an edge of the first fin 135. The drain structure 150 includes a drain 152 built on top of an epitaxial formation 158 covering a portion of the second fin 155 and dummy gate structures 154 and 156. The dummy gate structures 136 of the source structure 130 and dummy gate structures 154 and 156 of the drain structure 150 have no functionality related to the subject technology, and are shown as they are part of the normal finFET-based CMOS fabrication process flow.

FIG. 1B illustrates a top view 100B of the LDMOS device of FIG. 1A. The top view 100B shows regions 160, 170, and 180, respectively corresponding to the source structure 130, the dummy region 140, and drain structure 150 of the cross-sectional view 100A. A broken line A-A' shows an axis, across which the cross-sectional view 100A is shown. The region 160 shows a number of (e.g., three) first fins 135, portions of which are covered with the epitaxial formations 138 and the gate structure 134. The region 170 depicts a number of (e.g., three) dummy fins 145, and the region 180 shows a number of (e.g., three) second fins 155, partially covered with the epitaxial formations 158.

In one or more implementations, as shown in the cross-sectional view 100C of FIG. 1C, each of the dummy regions (e.g., 140) includes a dummy gate 142, dummy epitaxial formations 148, and dummy gate structures 144 and 146, disposed on the dummy fin 145. The LDMOS device shown in the cross-section view 100C is otherwise similar to the LDMOS device shown in the cross-section view 100A. It is understood that the high-voltage operation of the LDMOS device is achievable without these dummy structures including the dummy gate 142, the dummy epitaxial formations 148, and the dummy gate structures 144 and 146. These dummy structures are not essential to the operation of the subject technology and are added to conform to finFET-based CMOS fabrication process flow.

The dummy gate 142, although not essential, but when coupled to a suitable bias voltage, does not interfere with the high voltage operation of the device, as discussed below. It is important to note that the LDMOS device of the subject technology can be fabricated using normal finFET-based CMOS device fabrication process flow without additional masks or process steps, thus with no additional cost.

Figure 2A:
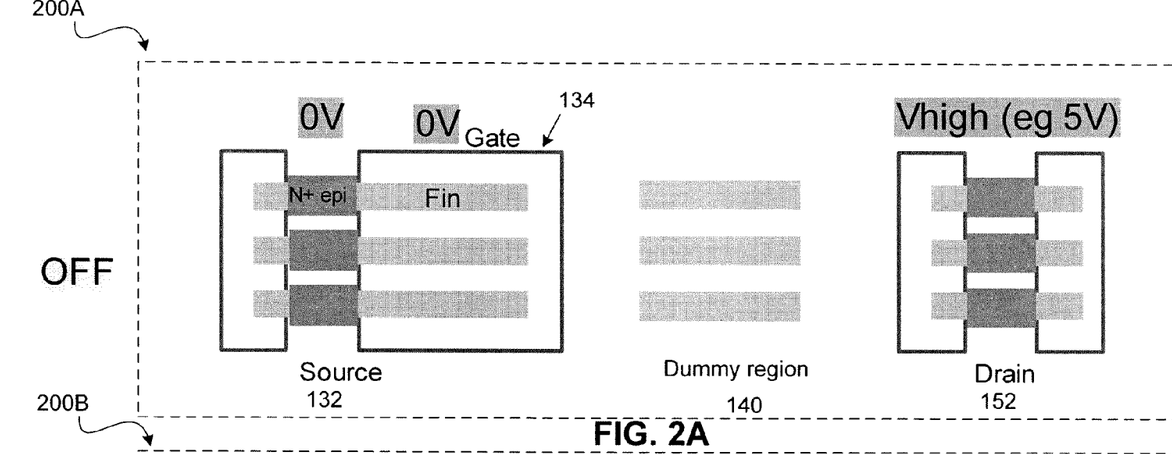
FIGS. 2A and 2B illustrate examples of high-voltage operation modes of the LDMOS bulk finFET device of FIG. 1A in accordance with one or more implementations.
Figure 2B:
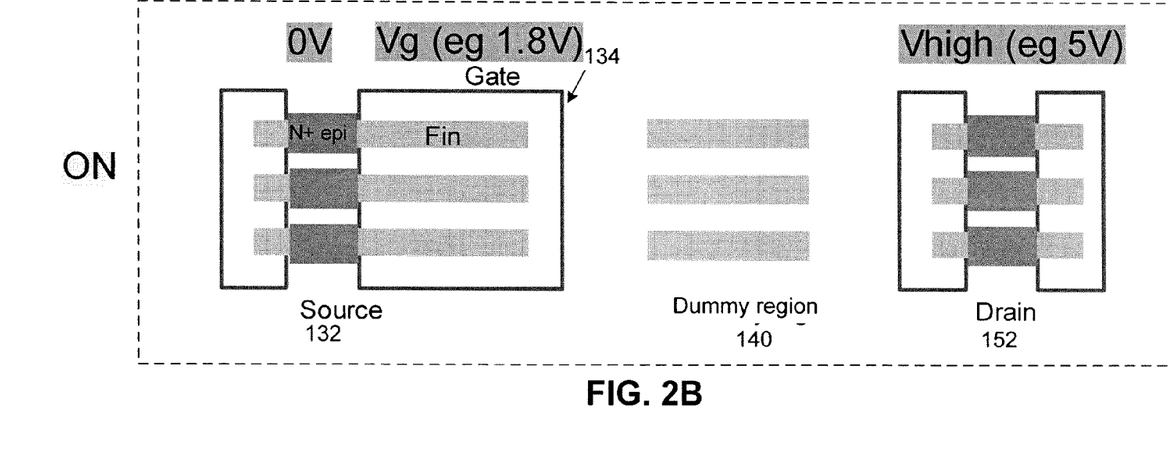

FIGS. 2A and 2B illustrate examples of high-voltage operation modes 200A and 200B of the LDMOS device of FIG. 1A in accordance with one or more implementations. In the off mode of the LDMOS device, as shown in the operation mode 200A, the source 132 and the gate 134 are connected to a lowest voltage (e.g., zero voltage such as ground potential) and the drain 152 is connected to a high voltage (e.g., 5V).

In the on mode of the LDMOS device, as shown in the operation mode 200B, the source 132 is connected to the lowest voltage (e.g., zero voltage such as ground potential) and the drain 152 is connected to a high voltage (e.g., 5V), while the gate 134 is connected to suitable gate voltage (e.g., 1.8V) above the threshold voltage of the LDMOS device. The dummy region 140 of the LDMOS device of FIGS. 2A and 2B has no dummy gates, therefore the dummy region 140 is not expected to interfere with the high-voltage operation of the LDMOS device.

Figure 3A:
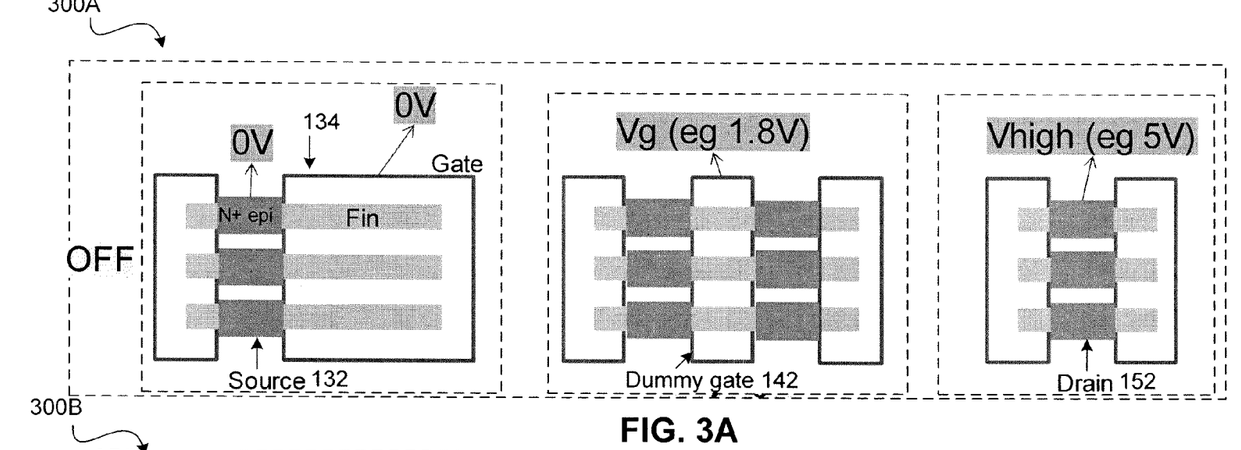
FIGS. 3A and 3B illustrate examples of high-voltage operation modes of an LDMOS bulk finFET device of FIG. 1C in accordance with one or more implementations.
Figure 3B:
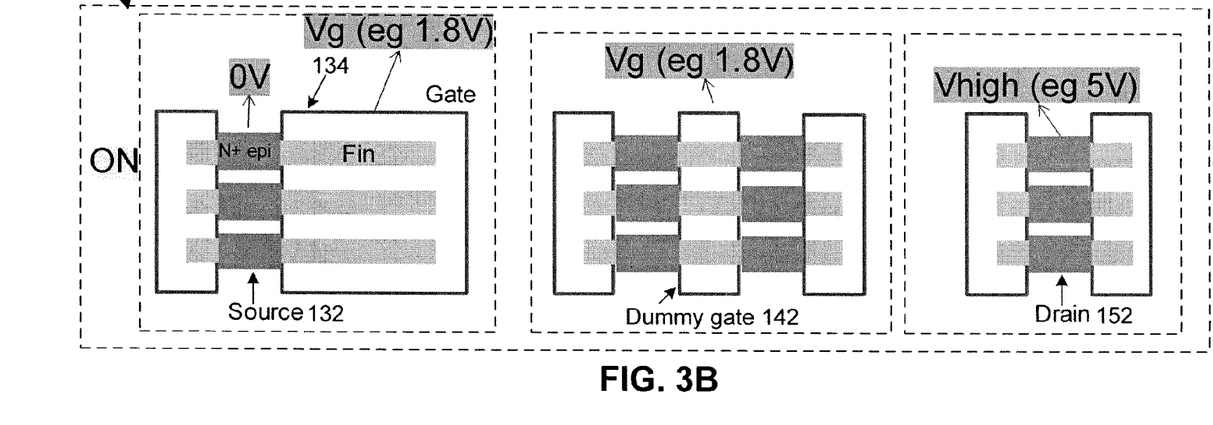

FIGS. 3A and 3B illustrate examples of high-voltage operation modes 300A and 300B of the LDMOS device of FIG. 1C in accordance with one or more implementations. In the off mode of the LDMOS device, as shown in the operation mode 300A, the source 132 and the gate 134 are connected to a lowest voltage (e.g., zero voltage such as ground potential) and the drain 152 is connected to a high voltage (e.g., 5V). The dummy region 140, as shown in FIG. 1C, includes the dummy gate 142, which, for the proper operation of the LDMOS device, is connected to a suitable voltage (e.g., 1.8 V) above the threshold voltage of the LDMOS device In the on mode of the LDMOS device, as shown in the operation mode 300B, the source 132 is connected to the lowest voltage (e.g., zero voltage such as ground potential) and the drain 152 is connected to a high voltage (e.g., 5V), while the gate 134 and the dummy gate 142 of FIG. 1C are connected to suitable gate voltage (e.g., 1.8V) above the threshold voltage of the LDMOS device.

Figure 4:
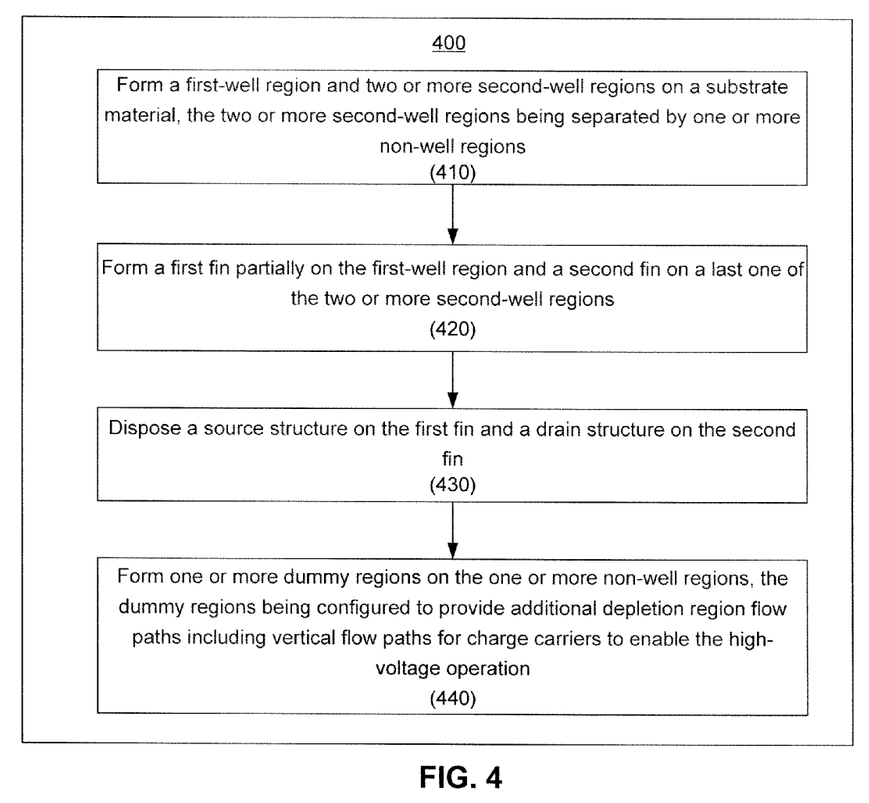
FIG. 4 illustrates an example of a method for forming an LDMOS bulk finFET device for high-voltage operation in accordance with one or more implementations.

FIG. 4 illustrates an example of a method 400 for forming an LDMOS device for high-voltage operation in accordance with one or more implementations. For explanatory purposes, the example method 400 is described herein with reference to, but is not limited to, the process disclosed with respect the LDMOS device of FIG. 1A. Further, for explanatory purposes, the blocks of the example method 400 are described herein as occurring in serial, or linearly. However, multiple blocks of the example method 400 can occur in parallel. In addition, the blocks of the example method 400 need not be performed in the order shown and/or one or more of the blocks of the example method 400 need not be performed.

The method 400 includes forming a first-well region (e.g., 110 of FIG. 1A) and two or more second-well regions (e.g., 120-1 and 120-2 of FIG. 1A) on a substrate material (e.g., 105 of FIG. 1A) (410). The two or more second-well regions are separated by one or more non-well regions (e.g., 115 of FIG. 1A). A first fin (e.g., 135 of FIG. 1A) is formed partially on the first-well region and a second fin (e.g., 155 of FIG. 1A) is formed on a last one of the two or more second-well regions (e.g., 120-2 of FIG. 1A) (420). A source structure (e.g., 130 of FIG. 1A) is disposed on the first fin and a drain structure (e.g., 150 of FIG. 1A) on the second fin (430). One or more dummy regions (e.g., 140 of FIG. 1A) are formed on the one or more non-well regions (440). The dummy regions provide additional depletion region flow paths (e.g., portions of path 160, which is in the dummy region 140 of FIG. 1A) including vertical flow paths for charge carriers to enable the high-voltage operation.

Figure 5:
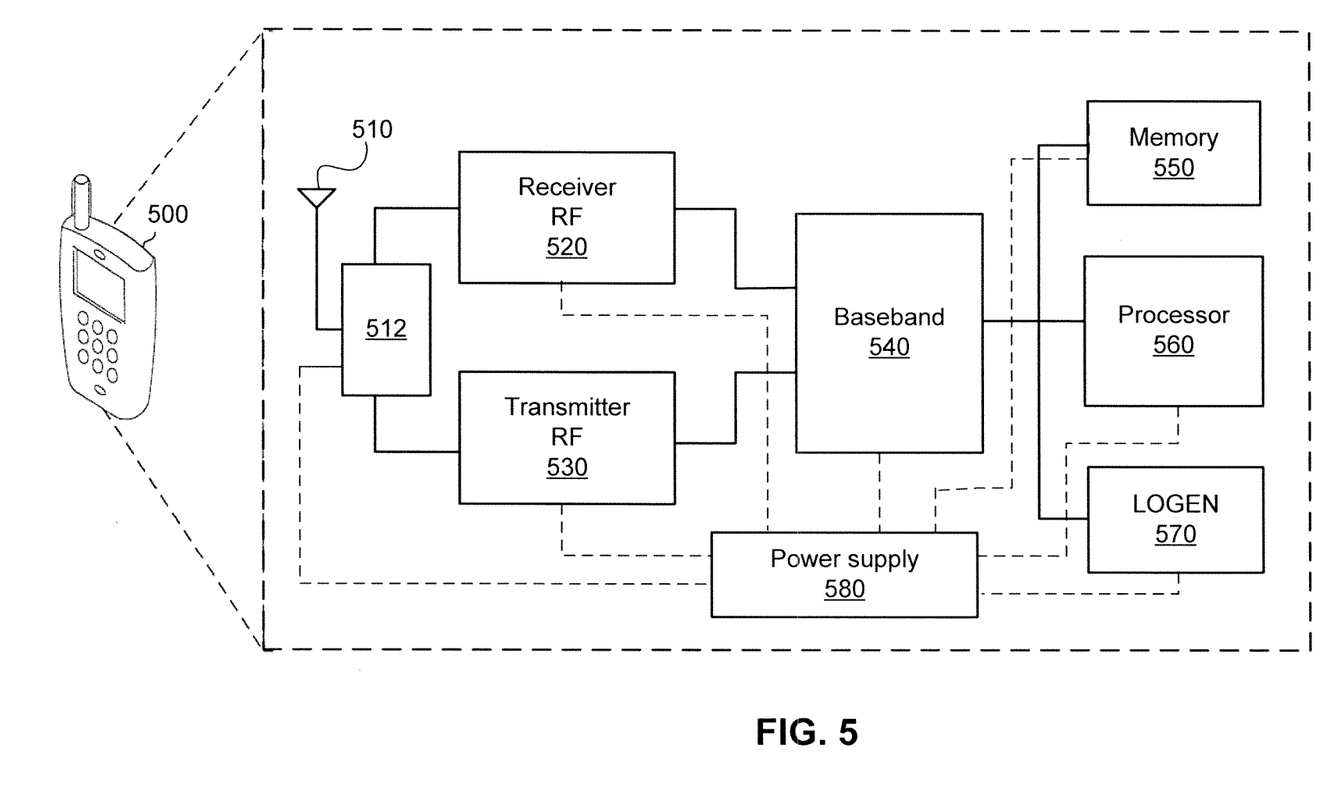
FIG. 5 illustrates an example of a wireless communication device in accordance with one or more implementations.

FIG. 5 illustrates an example of a wireless communication device in accordance with one or more implementations. The wireless communication device 500 includes a radio-frequency (RF) antenna 510, a receiver 520, a transmitter 530, a baseband processing module 540, a memory 550, a processor 460, a local oscillator generator (LOGEN) 570, and a power supply 580. In various embodiments of the subject technology, one or more of the blocks represented in FIG. 5 can be integrated on one or more semiconductor substrates. For example, the blocks 520-570 can be realized in a single chip or a single system on chip, or can be realized in a multi-chip chipset.

The RF antenna 510 can be suitable for transmitting and/or receiving RF signals (e.g., wireless signals) over a wide range of frequencies. Although a single RF antenna 510 is illustrated, the subject technology is not so limited.

The receiver 520 comprises suitable logic circuitry and/or code that can be operable to receive and process signals from the RF antenna 510. The receiver 520 may, for example, be operable to amplify and/or down-convert received wireless signals. In various embodiments of the subject technology, the receiver 520 is operable to cancel noise in received signals and can be linear over a wide range of frequencies. In this manner, the receiver 520 is suitable for receiving signals in accordance with a variety of wireless standards. Wi-Fi, WiMAX, Bluetooth, and various cellular standards.

The transmitter 530 comprises suitable logic circuitry and/or code that can be operable to process and transmit signals from the RF antenna 510. The transmitter 530 may, for example, be operable to up-convert baseband signals to RF signals and amplify RF signals. In various embodiments of the subject technology, the transmitter 530 is operable to up-convert and to amplify baseband signals processed in accordance with a variety of wireless standards. Examples of such standards include Wi-Fi, WiMAX, Bluetooth, and various cellular standards. In various embodiments of the subject technology, the transmitter 530 is operable to provide signals for further amplification by one or more power amplifiers.

In some implementations, the transmitter 530 includes an RF power amplifier that can be a high-voltage power amplifier fabricated using the LDMOS device (e.g. as shown in FIG. 1A or 1C) of the subject technology.

The duplexer 512 provides isolation in the transmit band to avoid saturation of the receiver 520 or damaging parts of the receiver 520, and to relax one or more design requirements of the receiver 520. Furthermore, the duplexer 512 can attenuate the noise in the receive band. The duplexer is operable in multiple frequency bands of various wireless standards.

The baseband processing module 540 comprises suitable logic, circuitry, interfaces, and/or code that can be operable to perform processing of baseband signals. The baseband processing module 540 may, for example, analyze received signals and generate control and/or feedback signals for configuring various components of the wireless communication device 500 such as the receiver 520. The baseband processing module 540 is operable to encode, decode, transcode, modulate, demodulate, encrypt, decrypt, scramble, descramble, and/or otherwise process data in accordance with one or more wireless standards.

The processor 560 comprises suitable logic, circuitry, and/or code that can enable processing data and/or controlling operations of the wireless communication device 500. In this regard, the processor 560 is enabled to provide control signals to various other portions of the wireless communication device 500. The processor 560 can also control transfers of data between various portions of the wireless communication device 500. Additionally, the processor 560 can enable implementation of an operating system or otherwise execute code to manage operations of the wireless communication device 500.

The memory 550 comprises suitable logic, circuitry, and/or code that can enable storage of various types of information such as received data, generated data, code, and/or configuration information. The local oscillator generator (LOGEN) 570 comprises suitable logic, circuitry, interfaces, and/or code that can be operable to generate one or more oscillating signals of one or more frequencies. The LOGEN 570 can be operable to generate digital and/or analog signals. In this manner, the LOGEN 570 can be operable to generate one or more clock signals and/or sinusoidal signals. Characteristics of the oscillating signals such as the frequency and duty cycle can be determined based on one or more control signals from, for example, the processor 560 and/or the baseband processing module 540.

In operation, the processor 560 can configure the various components of the wireless communication device 500 based on a wireless standard according to which it is desired to receive signals. Wireless signals can be received via the RF antenna 510 and amplified and down-converted by the receiver 520. The baseband processing module 540 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 550, and/or information affecting and/or enabling operation of the wireless communication device 500. The baseband processing module 540 can modulate, encode and perform other processing on audio, video, and/or control signals to be transmitted by the transmitter 530 in accordance to various wireless standards.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A lateral double-diffused MOS (LDMOS) bulk finFET device for high-voltage operation, the device comprising:
    a first-well region and two or more second-well regions formed on a substrate material and one or more non-well regions comprising substrate material, wherein the one or more non-well regions are configured to separate well regions of the two or more second-well regions;
    a source structure disposed on a first fin partially formed on the first-well region;
    a drain structure disposed on a second fin formed on a last one of the two or more second-well regions; and
    one or more dummy regions formed on the one or more non-well regions, wherein the one or more dummy regions are configured to provide additional depletion region flow paths including vertical flow paths for charge carriers to enable the high-voltage operation.

2. The device of claim 1, wherein the LDMOS bulk finFET device comprises an NLDMOS bulk finFET device.

3. The device of claim 1, wherein the LDMOS bulk finFET device comprises a PLDMOS bulk finFET device, the substrate material comprises a deep n-well in silicon, the first-well region comprises an n-well region, the two or more second-well regions comprise p-well regions, and the charge carriers comprise holes.

4. The device of claim 3, wherein each of the one or more dummy regions comprises a dummy fin formed on one of the one or more non-well regions, wherein each of the one or more dummy regions are configurable to allow the vertical flow paths for charge carriers to pass through the dummy fin.

5. The device of claim 4, wherein each of the one or more dummy regions comprises a dummy gate disposed on the dummy fin to conform to finFET-based CMOS fabrication process flow, wherein the high-voltage operation of the device is achievable without the dummy gate.

6. The device of claim 1, wherein the dummy gate is configured to allow the high voltage operation of the device, when coupled to a suitable bias voltage.

7. The device of claim 1, wherein the device is fabricated using finFET-based CMOS fabrication process flow without additional masks or process steps.

8. The device of claim 1, wherein the substrate material comprises p-type silicon.

9. The device of claim 1, wherein the first-well region comprises a p-well region.

10. The device of claim 1, wherein the two or more second-well regions comprise n-well regions, and the charge carriers comprise electrons.

11. The device of claim 1, wherein the additional depletion region flow paths are formed at a junction of one of the one or more non-well regions and a dummy fin.

12. The device of claim 11, wherein the dummy fin is formed on one of the one or more dummy regions.

13. The device of claim 12, wherein each of the one or more dummy regions are configurable to allow the vertical flow paths for charge carriers to pass through the dummy fin.

14. A method for forming a lateral double-diffused MOS (LDMOS) bulk finFET device for high-voltage operation, the method comprising:
    forming a first-well region and two or more second-well regions on a substrate material, wherein the two or more second-well regions are separated by one or more non-well regions;
    forming a first fin partially on the first-well region and a second fin on a last one of the two or more second-well regions;
    disposing a source structure on the first fin and a drain structure on the second fin; and
    forming one or more dummy regions on the one or more non-well regions, wherein the one or more dummy regions are configured to provide additional depletion region flow paths including vertical flow paths for charge carriers to enable the high-voltage operation.

15. The method of claim 14, wherein forming the LDMOS bulk finFET device comprises forming an NLDMOS bulk finFET device.

16. The method of claim 14, wherein forming the LDMOS bulk finFET device comprises forming a PLDMOS bulk finFET device, the substrate material comprises a deep n-well in silicon, forming the first-well region comprises forming an n-well region, forming the two or more second-well regions comprises forming p-well regions, and the charge carriers comprise holes.

17. The method of claim 16, wherein each of the one or more dummy regions comprises a dummy fin formed on one of the one or more non-well regions, and wherein each of the one or more dummy regions are configurable to allow the vertical flow paths for charge carriers to pass through the dummy fin.

18. The method of claim 17, wherein forming each of the one or more dummy regions comprises disposing a dummy gate on the dummy fin to conform to finFET-based CMOS fabrication process flow, wherein the high-voltage operation of the device is achievable without the dummy gate.

19. The method of claim 14, further comprising configuring the dummy gate to allow the high voltage operation of the device, when coupled to a suitable bias voltage.

20. The method of claim 14, further comprising fabricating the MVOS bulk finFET using finFET-based CMOS fabrication process flow without additional masks or process steps.

21. The method of claim 14, wherein the substrate material comprises p-type silicon.

22. The method of claim 14, wherein the first-well region comprises a p-well region.

23. The method of claim 14, wherein forming the two or more second-well regions comprises forming n-well regions, and the charge carriers comprise electrons.

24. The method of claim 14, further comprising providing the additional depletion region flow paths comprises forming the additional depletion region flow paths at a junction of one the one or more non-well regions and a dummy fin.

25. The method of claim 24, further comprising forming the dummy fin on one of the one or more dummy regions.

26. The method of claim 25, further comprising making each of the one or more dummy regions configurable to allow the vertical flow paths for charge carriers to pass through the dummy tin.

27. A communication device, comprising:
A transmitter circuit including a radio-frequency (RF) power amplifier, wherein the RF power amplifier is fabricated using lateral double-diffused MOS (LDMOS) bulk finFET devices for high-voltage operation, each LDMOS bulk finFET device comprising:
   a first-well region and two or more second-well regions formed on a substrate material and one or more non-well regions comprising substrate material, wherein the one or more non-well regions are configured to separate well regions of the two or more second-well regions;
   a source structure disposed on a first fin partially formed on the first-well region;
   a drain structure disposed on a second fin formed on a last one of the two or more second-well regions; and
   one or more dummy regions formed on the one or more non-well regions, wherein the dummy regions are configured to provide additional depletion region flow paths including vertical flow paths for charge carriers to enable the high-voltage operation.

28. The communication device of claim 27, wherein each of the one or more dummy regions comprises a dummy fin formed on one of the one or more non-well regions.

29. The communication device of claim 27, wherein each of the one or more dummy regions are configurable to allow the vertical flow paths for charge carriers to pass through the dummy fin.

30. The communication device of claim 27, wherein each of the one or more dummy regions comprises a dummy gate disposed on the dummy fin to conform to finFET-based CMOS fabrication process flow, wherein the high-voltage operation of the device is achievable without the dummy gate.

31. The communication device of claim 30, wherein the dummy gate is configured to allow the high voltage operation of the device, when coupled to a suitable bias voltage.

32. The communication device of claim 27, wherein the LDMOS bulk finFET device is fabricated using finFET-based CMOS fabrication process flow without additional masks or process steps.

33. A lateral double-diffused MOS (LDMOS) bulk finFET device for high-voltage operation, the device comprising:
   a substrate formed by a substrate material;
   a first-well region formed on the substrate;
   two or more second-well regions formed on the substrate;
   one or more non-well regions comprising substrate material and configured to separate well regions of the two or more second-well regions;
   a first fin partially formed on the first-well region;
   a source structure disposed on the first fin;
   a second fin formed on a last one of the two or more second-well regions;
   a drain structure disposed on the second fin; and
   one or more dummy regions formed on the one or more non-well regions and configured to provide additional depletion region flow paths including vertical flow paths for charge carriers to enable the high-voltage operation.

34. The device of claim 33, wherein the LDMOS bulk finFET device comprises an NLDMOS bulk finFET device, and wherein the device is fabricated using finFET-based CMOS fabrication process flow without additional masks or process steps.

* * * * *